(12) United States Patent
Coursey et al.

(10) Patent No.: US 9,147,803 B2
(45) Date of Patent: Sep. 29, 2015

(54) ENGINEERED SUBSTRATES HAVING EPITAXIAL FORMATION STRUCTURES WITH ENHANCED SHEAR STRENGTH AND ASSOCIATED SYSTEMS AND METHODS

(71) Applicant: Micron Technology, Inc., Boise, ID (US)

(72) Inventors: Belford T. Coursey, Boise, ID (US); F. Daniel Gealy, Kuna, ID (US); George E. Beck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/732,934

(22) Filed: Jan. 2, 2013

(65) Prior Publication Data

US 2014/0183443 A1     Jul. 3, 2014

(51) Int. Cl.
*H01L 33/12*    (2010.01)
*H01L 33/32*    (2010.01)
*H01L 33/00*    (2010.01)

(52) U.S. Cl.
CPC ............ *H01L 33/12* (2013.01); *H01L 33/0079* (2013.01); *H01L 33/32* (2013.01)

(58) Field of Classification Search
None
See application file for complete search history.

(56) References Cited

U.S. PATENT DOCUMENTS

| | | |
|---|---|---|
| 6,335,263 B1 | 1/2002 | Cheung et al. |
| 7,176,528 B2 | 2/2007 | Couillard et al. |
| 7,732,301 B1 | 6/2010 | Pinnington et al. |
| 7,790,565 B2 | 9/2010 | Gadkaree et al. |
| 2004/0053477 A1 | 3/2004 | Ghyselen et al. |
| 2005/0245049 A1 | 11/2005 | Akatsu et al. |
| 2009/0152559 A1* | 6/2009 | Miyairi et al. .................. 257/66 |
| 2010/0044670 A1* | 2/2010 | Ling ................................. 257/4 |
| 2010/0130706 A1* | 5/2010 | Jeon et al. ..................... 526/107 |
| 2011/0163381 A1* | 7/2011 | Yamazaki ..................... 257/347 |
| 2012/0001293 A1 | 1/2012 | Mohamed et al. |
| 2012/0003813 A1 | 1/2012 | Chuang et al. |
| 2012/0013013 A1* | 1/2012 | Sadaka et al. ................. 257/773 |
| 2012/0228672 A1* | 9/2012 | Daval et al. ................... 257/192 |
| 2012/0319121 A1 | 12/2012 | Reynaud et al. |
| 2013/0164916 A1* | 6/2013 | Liang et al. ................... 438/478 |

FOREIGN PATENT DOCUMENTS

KR     20110082863 A     7/2011

OTHER PUBLICATIONS

International Search Report and Written Opinion mailed Apr. 29, 2014 in International Application No. PCT/US2013/078503, 11 pages.

* cited by examiner

*Primary Examiner* — Khaja Ahmad
(74) *Attorney, Agent, or Firm* — Perkins Coie LLP

(57) ABSTRACT

Engineered substrates having epitaxial formation structures with enhanced shear strength and associated systems and methods are disclosed herein. In several embodiments, for example, an engineered substrate can be manufactured by forming a shear strength enhancement material at a front surface of a donor substrate and implanting ions a depth into the donor substrate through the shear strength enhancement material. The ion implantation can form a doped portion in the donor substrate that defines an epitaxial formation structure. The method can further include transferring the epitaxial formation structure from the donor substrate to a front surface of a handle substrate. The shear strength enhancement material can be positioned between the epitaxial formation structure and the front surface of the handle substrate and bridge defects in the front surface of the handle substrate.

18 Claims, 7 Drawing Sheets

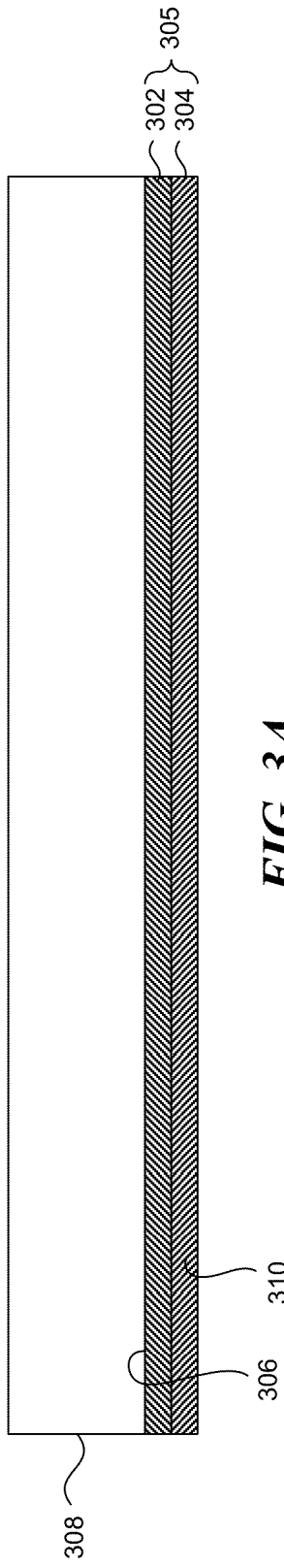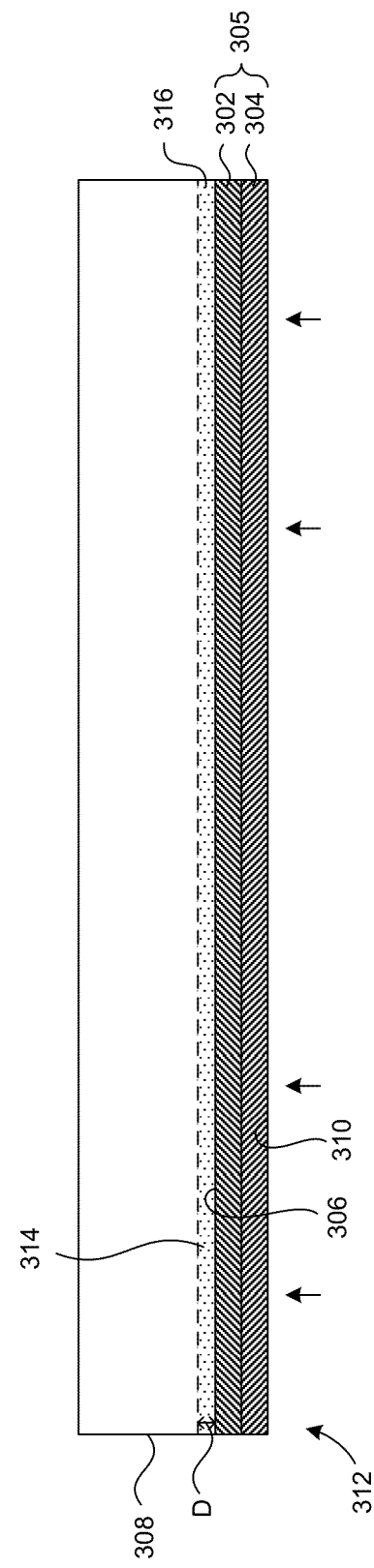

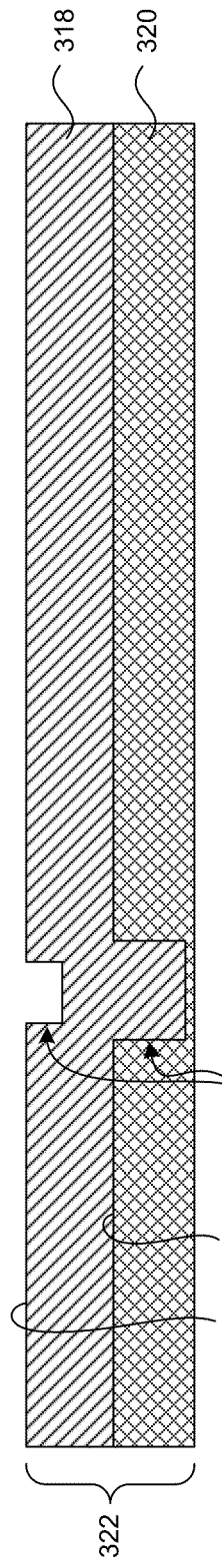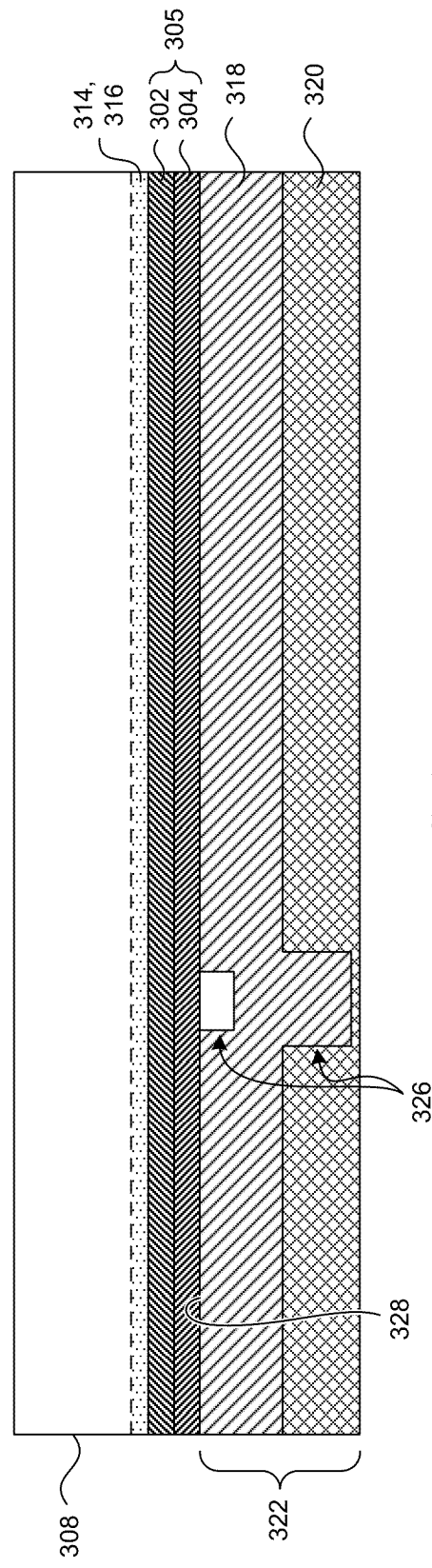

ENGINEERED SUBSTRATES HAVING EPITAXIAL FORMATION STRUCTURES WITH ENHANCED SHEAR STRENGTH AND ASSOCIATED SYSTEMS AND METHODS

TECHNICAL FIELD

The present technology relates to engineered substrates having epitaxial formation structures with enhanced shear strength and associated systems and methods.

BACKGROUND

Mobile phones, personal digital assistants ("PDAs"), digital cameras, MP3 players, and other portable electronic devices utilize light-emitting diodes ("LEDs"), organic light-emitting diodes ("OLEDs"), polymer light-emitting diodes ("PLEDs"), and other solid-state transducer ("SST") devices for, e.g., backlighting. SST devices are also used for signage, indoor lighting, outdoor lighting, and other types of general illumination. FIG. 1A is a cross-sectional view of a conventional SST device 10a with lateral contacts. As shown in FIG. 1A, the SST device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15, and P-type GaN 16. The SST device 10a also includes a first contact 17 on a forward-facing surface of the P-type GaN 16 and a second contact 19 spaced laterally apart from the first contact 17 on a forward-facing surface of the N-type GaN 15. The first contact 17 typically includes a transparent and conductive material (e.g., indium tin oxide ("ITO")) to allow light to escape from the LED structure 11. FIG. 1B is a cross-sectional view of another conventional SST device 10b in which the first and second contacts 17 and 19 are at opposite sides of the LED structure 11, e.g., in a vertical rather than lateral configuration. In the SST device 10b, the first contact 17 typically includes a reflective and conductive material (e.g., aluminum) to direct light toward the N-type GaN 15.

Several elements of the SST devices 10a and 10b shown in FIGS. 1A and 1B (e.g., the LED structure 11) can be grown epitaxially or otherwise formed on engineered substrates. Engineered substrates, such as silicon-on-insulator ("SOP") substrates, typically include a ceramic or glass substrate carrying a thin layer of silicon or other material that facilitates epitaxial growth. FIG. 2, for example, is a cross-sectional view of a conventional engineered substrate 22 during a manufacturing stage in which a formation structure 24 (e.g., a single crystal silicon) is transferred from a donor wafer 26 to a handle wafer 28. As shown in FIG. 2, the handle wafer 28 includes a substrate material 30 (e.g., ceramic or glass) and a defect mitigation material 32 (e.g., an oxide or nitride material) disposed on a forward-facing surface 34 of the substrate material 30. The defect mitigation material 32 reduces defects 36 (e.g., pits and voids) in the forward-facing surface 34 of the substrate material 30 such that the handle wafer 28 has a substantially smooth front surface 38 on which the formation structure 24 can be attached.

The donor wafer 26 can be doped with an exfoliation agent (e.g., hydrogen, boron, etc.) using an ion implantation process such that a portion of the donor wafer 26 (e.g., the formation structure 24) can later be separated from the donor wafer 26 via exfoliation. The donor wafer 26 is typically made from a material (e.g., silicon with an Si(1,1,1) crystal orientation) that has relatively low shear stress. Therefore, any defects 36 in the surface 38 of the handle wafer 28 not cured by the defect mitigation material 32 form weak points in the bond between the donor wafer 26 and the handle wafer 28 that may result in shear tear-out across the defects 36. As shown in FIG. 2, for example, a portion 40 of the formation structure 24 proximate the defect 36 in the handle wafer 28 tears away from the handle wafer 28 and remains with the donor wafer 26 is removed. Such voids or other defects in the formation structure 24 can affect epitaxial growth and translate defects to the SST structure that is subsequently formed thereon.

BRIEF DESCRIPTION OF THE DRAWINGS

FIGS. 3A-3F are cross-sectional views illustrating a method of forming an engineered substrate assembly in accordance with the present technology.

DETAILED DESCRIPTION

Specific details of several embodiments of engineered substrates having epitaxial formation structures with enhanced shear strength and associated systems and methods are described below. The term "SST" generally refers to solid-state transducers that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state devices that convert electromagnetic radiation into electricity. The term "substrate" can refer to supports for individual SST structures or devices and larger wafers that can support a plurality of SST structures or devices. A person skilled in the relevant art will also understand that the technology may have additional embodiments, and that the technology may be practiced without several of the details of the embodiments described below with reference to FIGS. 3A-4.

Figure 1A:
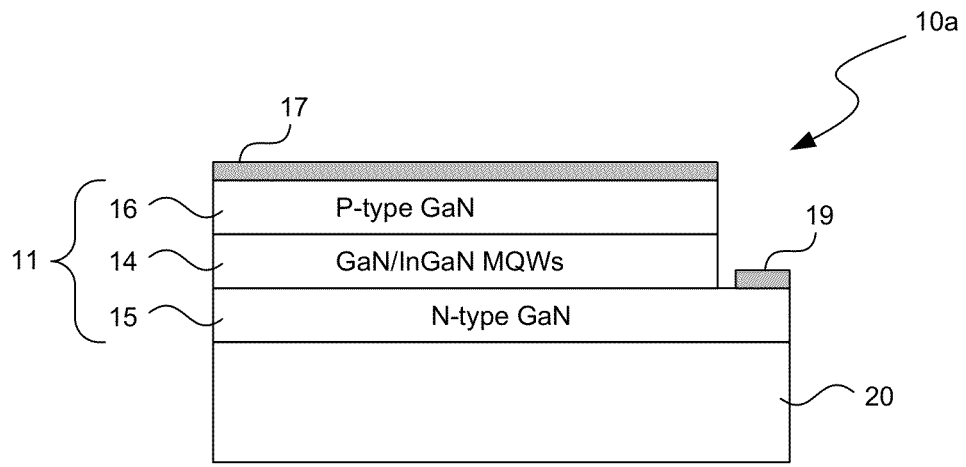
FIG. 1A is a partially schematic cross-sectional diagram of an SST device configured in accordance with the prior art.
Figure 1B:
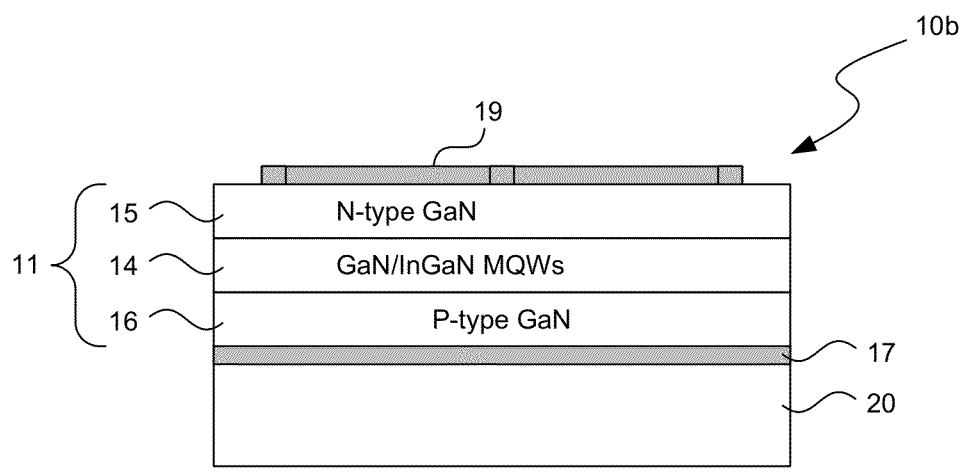
FIG. 1B is a partially schematic cross-sectional diagram of an SST device configured in accordance with another embodiment of the prior art.
Figure 2:
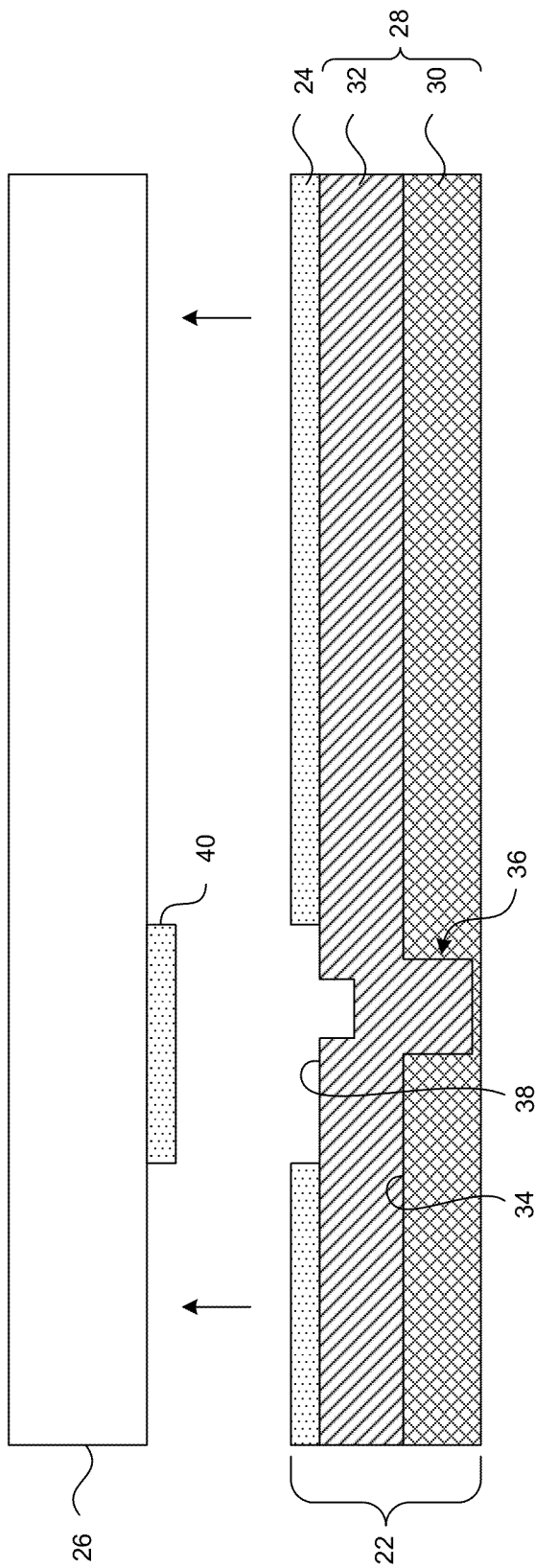
FIG. 2 is a cross-sectional view of an engineered substrate during a manufacturing stage in accordance with the prior art.
Figure 3E:
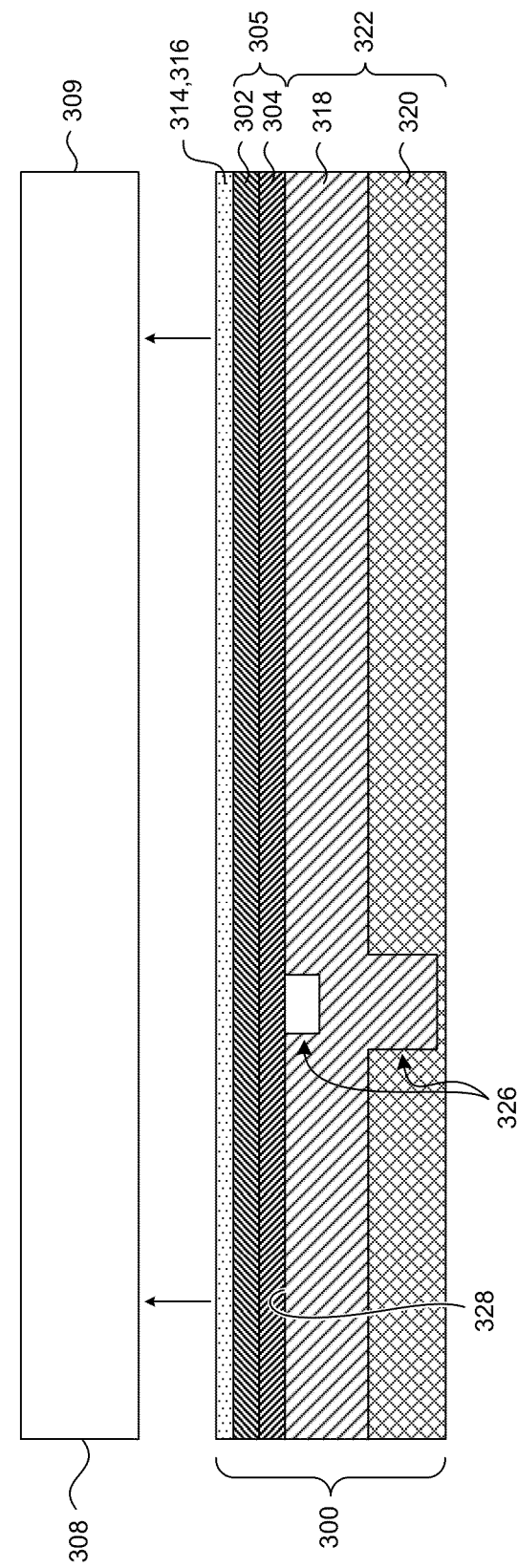

FIGS. 3A-3F are cross-section views illustrating a method of forming an engineered substrate assembly 300 (FIGS. 3E and 3F) in accordance with the present technology. FIG. 3A illustrates a stage in the process after a shear strength enhancement material 302 and a bonding material 304 (collectively referred to as a shear strength enhancement portion 305) have been formed on a front surface 306 of a donor substrate 308. The donor substrate 308 can include materials that facilitate epitaxial growth of III-nitride structures (e.g., an LED structure). For example, the donor substrate 308 can include silicon (Si), at least a portion of which has an Si(1,1,1) crystal orientation. In other embodiments, the donor substrate 308 can include single crystal silicon with other crystal orientations (e.g., Si(1,0,0)), aluminum gallium nitride (AlGaN), GaN, SiC, $Al_2O_3$, zinc oxide ($ZnO_2$), gallium arsenide (GaAs), a combination of the foregoing materials, and/or other suitable materials that facilitate epitaxial growth.

The shear strength enhancement material 302 can be formed on the front surface 306 of the donor substrate 308 using physical vapor deposition ("PVD"), chemical vapor deposition ("CVD"), atomic layer deposition ("ALD"), and/or other formation methods known in the art. The shear strength enhancement material 302 can include refractory metals (e.g., tin, titanium, tungsten, titanium aluminide, etc.), metal nitrides (e.g., titanium nitride, aluminum nitride, etc.), and/or other materials that have relatively high shear strengths (e.g., as compared to a silicon donor substrate that has a shear modulus of about 50 GPa). For example, the shear strength enhancement material 302 may include titanium nitride which has a shear modulus of about 200 GPa and/or tungsten which has a shear modulus of about 160-185 GPa. In other embodiments, the shear modulus of the shear strength enhancement material 302 can be at least about 80 GPa (e.g., about 80-160 GPa, about 80-100 GPa, etc.). The shear strength of the shear strength enhancement material 302 may vary depending upon the deposition method used. Therefore, in various embodiments the deposition method can be optimized to obtain a desired shear strength of the shear strength enhancement material 302. For example, increasing the temperature during deposition may increase the shear strength of the shear strength enhancement material 302. In other embodiments, the pressure, power, gas flow rate, magnetic strength, and/or other deposition parameters can be selected based on the desired properties of the shear strength enhancement material 302.

The bonding material 304 can be formed on the shear strength enhancement material 302 using PVD, CVD, ALD, spin on coating, and/or other suitable formation methods. The bonding material 304 may undergo an optional polishing step (e.g., using chemical-mechanical polishing ("CMP")) to thin the bonding material 304 and form a substantially smooth front surface 310 (e.g., flat, planar, low defect count, etc.). In various embodiments, for example, the bonding material 304 can have a thickness of about 250-350 Å (e.g., 300 Å) after polishing.

The bonding material 304 can be configured to bond the donor substrate 308 to a handle substrate (not shown) via oxide-oxide bonding. The bonding material 304 can therefore comprise materials that grow native oxides (e.g., amorphous polymers, amorphous silicon, oxides, etc.) to complete the oxide bond since materials with high shear strength (e.g., the shear strength enhancement material 302) do not typically form the requisite native oxides. In other embodiments, the bonding material 304 can attach the donor substrate 308 to an opposing handle substrate (not shown) using other suitable bonding techniques (e.g., hydrogen bonds, other chemical bonds, etc.) and/or adhesives.

FIG. 3B shows a later stage in the process in which the donor substrate 308 is doped with an exfoliation agent (e.g., boron (B), helium (He), hydrogen (H or $H_2$), or any combination thereof) using ion implantation and/or other suitable processes. The donor substrate can undergo ion implantation after the shear strength enhancement structure 305 has been formed to avoid exfoliation of the doped region that may be caused by the formation of the shear strength enhancement structure 305. As shown in FIG. 3B, for example, the ion implantation process can be applied to a front side 312 of the donor substrate 308 through the shear strength enhancement structure 305 (e.g., as indicated by the arrows). The ions penetrate a depth D into the donor substrate 308 to form a doped portion 314. In some embodiments, for example, ions can be implanted 500 nm into the donor substrate 308. In other embodiments, the parameters of the ion implantation process can be adjusted to implant ions a greater or smaller distance into the donor substrate 308. The doped portion 314 can define an epitaxial formation structure 316 that is later removed (along with the shear strength enhancement structure 305) from the donor substrate 308 by exfoliating at the edge of the doped portion.

FIG. 3C illustrates a handle substrate 322 after a defect mitigation material 318 has been formed on a front surface 324 of a substrate material 320. In this embodiment, the substrate material 320 and the defect mitigation material 318 together define a handle substrate 322 that is subsequently bonded to the epitaxial formation structure 316 (FIG. 3B). The substrate material 320 can be made from an insulating material (e.g., ceramic, glass, etc.) and/or other suitable substrate materials (e.g., insulating or non-insulating materials, silicon, etc.). In certain embodiments, the substrate material 320 may include a polycrystalline ceramic material that has a coefficient of thermal expansion (CTE) substantially similar to the CTE of N-type gallium nitride (GaN) and/or other III-nitrides to reduce thermal stress during epitaxial growth of III-nitrides. The substrate material 320 may include, for example, compositions of $Si_3N_4$, TiN, ZrN, HfN, AlN, $SiO_2$, $Al_2O_3$, AlON, TiC, ZrC, HfC, SiC, $Y_2O_3$ and/or other suitable polycrystalline ceramics.

As shown in FIG. 3C, the front surface 324 of the substrate material 320 may include pits, voids, and/or other defects 326. Although only one defect 326 is shown in FIG. 3C, a person skilled in the art will appreciate that the front surface 324 of the substrate material 320 may include numerous defects 326 that are inherently part of the surface topology of the substrate material 320 and/or caused by subsequent manufacturing processes. For example, polishing the substrate material 320 (e.g., to form a smooth forward-facing surface 324) may incidentally rip out or otherwise remove one or more grains of the substrate material 320, leaving holes or voids in the front surface 324 of the substrate material 320. Depending upon the grain size of the substrate material 320 (e.g., 2-5 µm for a polyaluminum nitride substrate), these polishing-induced holes may be relatively large (e.g., 4 µm or larger). Even larger defects 326 may be caused by other manufacturing processes, such as an accelerant spilling on or otherwise contacting portions of the handle substrate 322, poorly mixed binding agents or sintering agents, etc.

The defect mitigation material 318 can be formed in one or more coats on the front surface 324 of the substrate material 320 to at least partially fill the holes or otherwise mitigate the defects 326 in the front surface 324 and/or provide a substantially planar front surface 328 of the handle substrate 322 to which the donor substrate 308 (FIG. 3B) can be bonded. The defect mitigation material 318 can be formed using PVD, CVD, ALD, spin-on coating, patterning, and/or other suitable formation methods, and may optionally be thinned (e.g., using CMP) to reduce its thickness and/or smooth the front surface 328 of the handle substrate 322.

As shown in FIG. 3C, the defect mitigation material 318 may only partially remove the defects 326 in the front surface 324 of the substrate material 320. In various embodiments, the defect mitigation material 318 can be formed on the substrate material 320 to provide a substantially planar front surface 328 of the handle substrate 322 for bonding to the donor substrate 308 (FIG. 3B). For example, the defect mitigation material 318 may be deposited such that the front surface 328 has an intra-granular roughness of about 50 nm with larger defects 326 interspersed throughout. In other embodiments, the front surface 328 of the handle substrate 322 may have a higher or lower surface defectivity.

The defect mitigation material 318 can be made from a material (e.g., an oxide) that can form an oxide-oxide bond with a portion of the donor substrate 308 (FIG. 3B) and/or otherwise attach the handle substrate 322 to the donor substrate 308 (FIG. 3B). As shown in FIG. 3D, for example, the front surface 310 of the bonding material 304 on the donor substrate 308 and the front surface 328 of the handle substrate 322 can be joined together to form an oxide-oxide bond. The handle substrate 322 and the donor substrate 308 can be bonded together at ambient pressure or in a vacuum depending upon the size of the defects remaining on the handle substrate 322. In other embodiments, the donor substrate 308 can be attached to the handle substrate 322 using suitable bonding techniques known in the art.

FIG. 3E illustrates a later stage in the process after a portion 309 of the donor substrate 308 has been removed from the handle substrate 322 via exfoliation. Exfoliating the donor substrate 308 separates the un-doped portion 309 of the donor substrate 308 (e.g., that was that was not subject to ion implantation) from the doped portion 314, leaving the doped portion 314 attached to the handle substrate 322. The remaining structure (e.g., the handle substrate 322, the shear strength enhancement structure 305, and the epitaxial formation structure 316) can define the engineered substrate assembly 300. The doped portion 314 defines the epitaxial formation structure 316 on which an SST structure and/or other semiconductor structures can be formed.

Unlike conventional manufacturing processes that result in shear tear-out across defects in a handle substrate, several embodiments of the exfoliation process shown in FIG. 3E are expected to provide a substantially clean separation between the donor substrate 308 and the epitaxial formation structure 316 transferred to the handle substrate 322. The shear strength enhancement structure 305 increases the strength of the materials transferred to the handle substrate 322 (e.g., the epitaxial formation structure 316). This makes the epitaxial formation structure 316 more robust, and therefore allows the epitaxial formation structure 316 to extend across or bridge defects 326 in the front surface 328 of the handle substrate 322 and resist shear tear-out at non-bonded areas (e.g., where there is a void in the front surface 328). In various embodiments, the thickness of the shear strength enhancement material 302 can be selected based on the shear strength required to bridge the defects 326 in the handle substrate 322. For example, the shear strength enhancement material 302 may have a thickness of about 250-500 Å or larger (e.g., about 350-50,000 Å, up to about 1,000 Å, up to about 50,000 Å (5 μm), etc.) depending upon the size of the defects 326 (e.g., grain size defects, larger manufacturing-induced defects, etc.).

The increased shear strength of the epitaxial formation structure 316 is expected to decrease the defect mitigation applied to the underlying handle substrate 322. For example, the defect mitigation material 318 may be applied to the substrate material 320 to form a suitable bonding surface and complete the oxide bond with the opposing bonding material 304, but leave defects 326 in the front surface 328 of the handle substrate 322. Therefore, rather than depositing a thick layer of the defect mitigation material 318 to fill larger defects 326 (e.g., 4 μm) in the substrate material 320, the defect mitigation material 318 can be a thinner film (e.g., having a thickness of about 500 nm). Accordingly, the increased strength of the transferred materials in the engineered substrate assembly 300 can simplify the processing of the handle substrate 322 and reduce overall manufacturing costs by requiring less defect mitigation and decreasing the defects (e.g., shear tear-out) formed in the epitaxial formation structure 316.

Figure 3F:
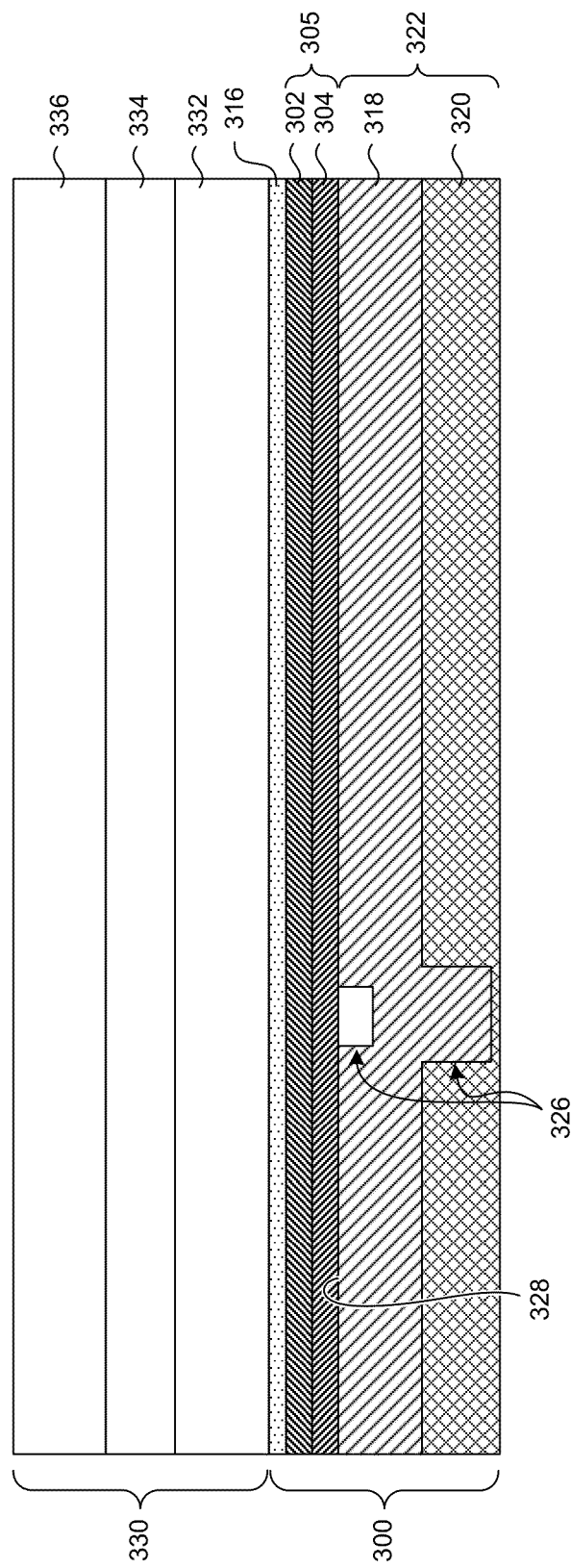

As shown in FIG. 3F, the process can further include forming an SST structure 330 on the engineered substrate assembly 300. The SST structure 330 can be configured to emit light in the visible spectrum (e.g., from about 390 nm to about 750 nm), in the infrared spectrum (e.g., from about 1050 nm to about 1550 nm), and/or in other suitable spectra. In the illustrated embodiment, the SST structure 330 includes a first semiconductor material 332, an active region 334, and a second semiconductor material 336 formed sequentially on the epitaxial formation structure 316. The first semiconductor material 332 can include an N-type semiconductor (e.g., an N-type gallium nitride ("N-GaN")), and the second semiconductor material 336 can include a P-type semiconductor material (e.g., a P-type gallium nitride ("P-GaN")). In selected embodiments, the first and second semiconductor materials 332 and 336 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials.

The active region 334 can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region 334 can include an InGaN SQW, GaN/InGaN MQWs, and/or an InGaN bulk material. In other embodiments, the active region 334 can include aluminum gallium indium phosphide (AlGaInP), aluminum gallium indium nitride (AlGaInN), and/or other suitable materials or configurations.

The SST structure 330 can be formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques. In other embodiments, the SST structure 330 can also include other suitable components, such as a buffer material that facilitates the formation of the first and second semiconductor materials 332 and 336 and the active region 334 on the epitaxial formation structure 316. In further embodiments, the SST structure 330 can include additional bonding and seed layers to facilitate bonding and/or epitaxial growth. The engineered substrate assembly 300 can facilitate epitaxial growth of SST structure 330. For example, the epitaxial formation structure 316 is at least less likely to have surface defects (e.g., caused by shear tear-out), and therefore provide substantially planar surface on which the SST structure 330 can be formed. Therefore, it is expected that the engineered substrate assembly 300 translates less defects to the SST structure 330 than conventional engineered substrates.

Once formed, the SST structure 330 can be integrated into an SST device. For example, the method can further include forming other features of an SST device, such as forming a lens over the SST structure 330, a mirror on a back side of the SST structure 330, electrical contacts on or in the SST structure 330, and/or other suitable mechanical/electrical components (not shown). In various embodiments, the SST structure 330 can be removed from the engineered substrate assembly 300 before being integrated into an SST device. The engineered substrate assembly 300 can be removed by backgrinding, etching, polishing (e.g., CMP), and/or otherwise material removal process. In other embodiments, the engineered substrate assembly 300 or a portion thereof (e.g., the epitaxial formation structure 316 can remain attached to the SST structure 330 during subsequent manufacturing steps.

Figure 4:
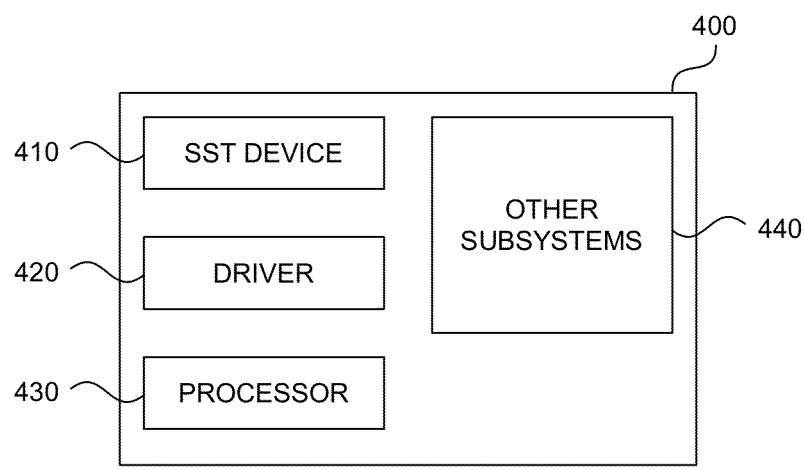
FIG. 4 is a schematic view of an SST system including devices made using an engineered substrate assembly in accordance with the present technology.

The engineered substrate assembly 300 described above with reference to FIGS. 3A-3F can be used to form SST structures and/or other semiconductor structures that are incorporated into any of a myriad of larger and/or more complex devices or systems, a representative example of which is system 400 shown schematically in FIG. 4. The system 400 can include one or more SST devices 410, a driver 420, a processor 430, and/or other subsystems or components 440. The resulting system 400 can perform any of a wide variety of functions, such as backlighting, general illumination, power generations, sensors, and/or other suitable functions. Accordingly, representative systems 400 can include, without limitation, hand-held devices (e.g., mobile phones, tablets, digital readers, and digital audio players), lasers, photovoltaic cells, remote controls, computers, and appliances. Components of the system 400 may be housed in a single unit or distributed over multiple, interconnected units (e.g., through a communications network). The components of the system 400 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. For example, the engineered substrate assembly 300 shown in FIGS. 3E and 3F includes a shear strength enhancement structure 305 with one shear strength enhancement material 302 and one bonding material 304. However, in other embodiments engineered substrate assemblies in accordance with the present technology can include strength enhancement structures 305 with additional layers of materials. Certain aspects of the new technology described in the context of particular embodiments may also be combined or eliminated in other embodiments. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. An engineered substrate assembly, comprising:
    a substrate material;
    a defect mitigation material on the substrate material, wherein the defect mitigation material has a front surface with intra-granular roughness and defects interspersed throughout, and wherein the defects are larger than the intra-granular roughness;
    a shear strength enhancement material on the front surface of the defect mitigation material, wherein the shear strength enhancement material comprises a refractory metal and a metal nitride, and wherein the shear strength enhancement material is configured to bridge the defects in the front surface of the defect mitigation material;
    a bonding material between the shear strength enhancement material and the defect mitigation material, wherein the bonding material is configured to form an oxide bond with the defect mitigation material; and
    an epitaxial formation structure on the shear strength enhancement material.

2. The engineered substrate assembly of claim 1, wherein
    the substrate material comprises a polycrystalline ceramic;
    the defect mitigation material comprises an oxide material;
    the refractory metal and/or the metal nitride having a shear modulus of at least 160 GPa; and
    the epitaxial formation structure comprises silicon having a Si(1,1,1) crystal orientation.

3. The engineered substrate assembly of claim 1, wherein the shear strength enhancement material comprises at least one of titanium nitride, tungsten, tungsten nitride, aluminum nitride, and titanium aluminide.

4. The engineered substrate assembly of claim 1 wherein
    the substrate material comprises a polycrystalline ceramic; and
    the epitaxial formation structure comprises single crystal silicon.

5. The engineered substrate assembly of claim 1, wherein the bonding material is configured to grow native oxides to bond to the defect mitigation material.

6. The engineered substrate assembly of claim 1, further comprising:
    a first semiconductor material formed on the epitaxial formation structure, the first semiconductor material comprising N-type gallium nitride (GaN);
    an active region on the first semiconductor material, the active region comprising at least one of a bulk indium gallium nitride (InGaN), an InGaN single quantum well, and GaN/InGaN multiple quantum wells; and
    a second semiconductor material on the active region, the second semiconductor material comprising P-type GaN.

7. A substrate assembly, comprising:
    a donor substrate having a front surface, wherein the donor substrate includes an epitaxial growth material;
    a shear strength enhancement material on the front surface of the donor substrate, wherein the shear strength enhancement material comprises a refractory metal and a metal nitride having a shear modulus of at least 160 GPa;
    a bonding material spaced apart from the front surface of the donor substrate by the shear strength enhancement material, wherein the bonding material is configured to grow native oxides; and
    a defect mitigation material in contact with the bonding material, wherein the defect mitigation material has a front surface with intra-granular roughness and defects interspersed throughout, and wherein the defects are larger than the intra-granular roughness.

8. The substrate assembly of claim 7, wherein the donor substrate comprises a single crystal silicon.

9. The substrate assembly of claim 7, wherein the shear strength enhancement material comprises at least one of titanium nitride, tungsten, tungsten nitride, aluminum nitride, and titanium aluminide.

10. The substrate assembly of claim 7, wherein the bonding material comprises an amorphous polymer.

11. A light emitting diode (LED) device, comprising:
    an engineered substrate including a substrate material, a defect mitigation material on the substrate material, wherein the defect mitigation material has a front surface with intra-granular roughness and defects interspersed throughout, and wherein the defects are larger than the intra-granular roughness, a shear strength enhancement structure on the defect mitigation material, and an epitaxial formation structure on the shear strength enhancement structure, wherein the shear strength enhancement structure includes a shear strength enhancement material comprising a refractory metal and a metal nitride;
    a bonding material in direct contact with the shear strength enhancement material and the defect mitigation material, wherein the bonding material is an amorphous polymer; and
    an LED structure on the epitaxial formation structure.

12. The LED device of claim 11, wherein the defect mitigation material comprises an oxide material.

13. The LED device of claim 11, wherein the shear strength enhancement material comprises at least one of titanium, tungsten, and titanium aluminide.

14. The LED device of claim 11, wherein the shear strength enhancement material has a shear modulus of about 160-200 GPa.

15. The LED device of claim 11, wherein the substrate material comprises at least one of a polycrystalline ceramic material and a silicon material.

16. The LED device of claim 11, wherein the epitaxial formation structure comprises single crystal silicon.

17. The LED device of claim 11, wherein
the epitaxial formation structure comprises silicon having a Si(1,1,1) crystal orientation; and
the LED structure comprises:
a first semiconductor material formed on the epitaxial formation structure, the first semiconductor material comprising N-type gallium nitride (GaN),
an active region on the first semiconductor material, the active region comprising at least one of a bulk indium gallium nitride (InGaN), an InGaN single quantum well, and GaN/InGaN multiple quantum wells, and
a second semiconductor material on the active region, the second semiconductor material comprising P-type GaN.

18. The LED device of claim 11, wherein the shear strength enhancement material has a thickness of about 250-50,000 Å.

\* \* \* \* \*